(12) United States Patent
Kim et al.

(10) Patent No.: US 9,455,207 B2
(45) Date of Patent: Sep. 27, 2016

(54) ALL-IN-ONE POWER SEMICONDUCTOR MODULE

(71) Applicant: SAMSUNG ELECTRO-MECHANICS CO., LTD., Suwon (KR)

(72) Inventors: Kwang Soo Kim, Suwon (KR); Si Joong Yang, Suwon (KR); Bum Seok Suh, Suwon (KR); Young Hoon Kwak, Suwon (KR); Job Ha, Suwon (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 468 days.

(21) Appl. No.: 13/830,122

(22) Filed: Mar. 14, 2013

(65) Prior Publication Data

US 2014/0118956 A1    May 1, 2014

(30) Foreign Application Priority Data

Oct. 31, 2012  (KR) .................. 10-2012-0122515

(51) Int. Cl.
*H01L 23/043* (2006.01)
*H01L 23/049* (2006.01)
*H01L 23/00* (2006.01)
(Continued)

(52) U.S. Cl.
CPC .......... *H01L 23/043* (2013.01); *H01L 23/049* (2013.01); *H01L 24/36* (2013.01); *H01L 24/40* (2013.01); *H01L 23/14* (2013.01); *H01L 23/3735* (2013.01); *H01L 2224/40095* (2013.01); *H01L 2224/40137* (2013.01); *H01L 2224/40225* (2013.01); *H01L 2224/48091* (2013.01); *H01L 2924/12041* (2013.01);
(Continued)

(58) Field of Classification Search
None
See application file for complete search history.

(56) References Cited

U.S. PATENT DOCUMENTS 5,481,798 A * 1/1996 Ohsawa et al. ................ 29/827
6,144,571 A * 11/2000 Sasaki et al. ................ 363/144
(Continued)

FOREIGN PATENT DOCUMENTS

| CN | 1270702 | 10/2000 |
|---|---|---|
| CN | 101071809 | 11/2007 |

(Continued)

OTHER PUBLICATIONS

Office action dated Dec. 6, 2013 from corresponding Korean Patent Application No. 10-2012-0122515 and its English summary provided by the clients.

(Continued)

*Primary Examiner* — Xanthia C Cunningham
(74) *Attorney, Agent, or Firm* — Ladas & Parry, LLP

(57) ABSTRACT

Disclosed herein is an all-in-one power semiconductor module including a plurality of first semiconductor devices formed on a substrate; a housing molded and formed to include bridges formed across upper portions of the plurality of first semiconductor devices; and a plurality of lead members integrally formed with the housing and electrically connecting the plurality of first semiconductor devices and the substrate.

According to the present invention, reliability can be improved by increasing bonding areas and bonding strength of semiconductor devices as well as processibilty can be enhanced and failure is reduced by adjusting a step difference with respect to an arrangement and height of the semiconductor devices. Further, a processing time resulting from an omission of a wire bonding process is reduced.

9 Claims, 2 Drawing Sheets

(51) Int. Cl.
*H01L 23/14* (2006.01)
*H01L 23/373* (2006.01)

(52) U.S. Cl.
CPC ............ *H01L 2924/1305* (2013.01); *H01L 2924/13055* (2013.01); *H01L 2924/19105* (2013.01)

(56) References Cited

U.S. PATENT DOCUMENTS

| | | | |
|---|---|---|---|
| 6,313,598 B1* | 11/2001 | Tamba et al. | 318/722 |
| 6,486,548 B1 | 11/2002 | Nakatsu et al. | |
| 6,507,098 B1* | 1/2003 | Lo et al. | 257/686 |
| 6,572,387 B2* | 6/2003 | Burns et al. | 439/69 |
| 6,574,107 B2* | 6/2003 | Jeon et al. | 361/709 |
| 6,603,197 B1* | 8/2003 | Yoshida et al. | 257/676 |
| 6,710,439 B2* | 3/2004 | Lee et al. | 257/691 |
| 6,774,465 B2* | 8/2004 | Lee et al. | 257/671 |
| 6,777,787 B2* | 8/2004 | Shibata | 257/666 |
| 6,972,479 B2* | 12/2005 | Chen et al. | 257/666 |
| 7,061,080 B2* | 6/2006 | Jeun et al. | 257/676 |
| 7,706,146 B2* | 4/2010 | Lee et al. | 361/752 |
| 7,751,194 B2* | 7/2010 | Sakamoto et al. | 361/719 |
| 8,102,670 B2* | 1/2012 | Sakamoto et al. | 361/796 |
| 8,169,784 B2* | 5/2012 | Sakamoto et al. | 361/729 |
| 8,198,139 B2* | 6/2012 | Yang | 438/123 |
| 8,338,942 B2 | 12/2012 | Lederer et al. | |
| 8,358,515 B2* | 1/2013 | Chen et al. | 361/816 |
| 8,796,831 B2* | 8/2014 | Yang et al. | 257/676 |
| 8,842,436 B2* | 9/2014 | Hattori et al. | 361/720 |
| 8,842,438 B2* | 9/2014 | Kim et al. | 361/728 |
| 8,890,310 B2* | 11/2014 | Lee et al. | 257/706 |
| 2003/0071346 A1* | 4/2003 | Smith et al. | 257/696 |
| 2007/0272976 A1 | 11/2007 | Popp et al. | |
| 2008/0007918 A1* | 1/2008 | Lederer et al. | 361/707 |
| 2009/0129432 A1* | 5/2009 | Luniewski | 374/100 |
| 2009/0134482 A1 | 5/2009 | Popp et al. | |
| 2009/0261472 A1* | 10/2009 | Bayerer | 257/719 |
| 2010/0065962 A1* | 3/2010 | Bayerer et al. | 257/703 |
| 2011/0075451 A1* | 3/2011 | Bayerer et al. | 363/37 |
| 2012/0300522 A1* | 11/2012 | Tokuyama et al. | 363/131 |
| 2013/0203218 A1* | 8/2013 | Bayerer et al. | 438/121 |

FOREIGN PATENT DOCUMENTS

| | | |
|---|---|---|
| CN | 101090109 | 12/2007 |
| CN | 101436585 | 5/2009 |
| KR | 10-2009-0050987 A | 5/2009 |
| KR | 10-2011-0090299 A | 8/2011 |
| KR | 10-2012-0070683 | 7/2012 |

OTHER PUBLICATIONS

Office Action dated Dec. 28, 2015 for Chinese Patent Application No. 201310533320.9 and its English translation provided by Applicant's foreign counsel.

* cited by examiner

ALL-IN-ONE POWER SEMICONDUCTOR MODULE

CROSS REFERENCE TO RELATED APPLICATION

This application claims the benefit of Korean Patent Application No. 10-2012-0122515, filed on Oct. 31, 2012, entitled "All-In-One Power Semiconductor Module", which is hereby incorporated by reference in its entirety into this application.

BACKGROUND OF THE INVENTION

1. Technical Field

The present invention relates to an all-in-one power semiconductor module.

2. Description of the Related Art

As an amount of used energy increases worldwide, an interest in an efficient use of limited energy increases. Accordingly, an inverter to which a power semiconductor module and an intelligent power module (IPM) are applied has been increasingly employed for an efficient power conversion of energy over all fields including home appliances, industry, renewal energy, battlefield, etc.

According to an expanding application of the power semiconductor module, a market request has been further high performance, high efficiency, high reliability, and low expense. In particular, reliability of the power semiconductor module that is core parts of an inverter is directly related to performance of the power semiconductor module, and thus the reliability has been emerging as an important issue in addition to the high performance, high efficiency, and high reliability of the power semiconductor module.

However, in connection with the power semiconductor module, the issue of reliability remains unsolved. In particular, a continuous technology development has been made to wire bonding that fails most in a reliability test.

The patent document disclosed in the following prior art relates to a light source module having a light emitting diode package. A description thereof will now be described in brief.

The light source module includes a printed circuit board (PCB) and a plurality of light emitting diode packages. Each of the plurality of light emitting diode packages includes (1) a light emitting chip that is formed on the PCB and generates light, (2) a case including a floor unit and side walls connected to the floor unit and accommodates the light emitting chip, (3) first and second lead frames that are spaced apart from each other and are electrically connected to the light emitting chip, and (4) a dummy lead frame that is spaced apart from the light emitting chip and the first and second lead frames and is electrically insulated therefrom. Also, the plurality of light emitting diode packages is divided into a plurality of driving blocks. The light emitting diode packages of a first driving block among the plurality of driving blocks are electrically connected to the light emitting diode packages of a second driving block through the dummy lead frame.

The patent document discloses the technical construction of electrically connecting semiconductor devices like the light emitting chip through a lead frame in the light source module including the above-described light emitting diode packages that. However, the light source module connects a substrate and semiconductor devices through wire bonding, which involves reliability, processibilty, and failure problems.

PRIOR ART DOCUMENT

Patent Document (Patent Document 1) Korean Patent Laid-Open Publication No. 2012-0070683

SUMMARY OF THE INVENTION

The present invention has been made in an effort to provide an all-in-one power semiconductor module that improves reliability by increasing bonding areas and bonding strength of semiconductor devices.

Further, the present invention has been made in an effort to provide an all-in-one power semiconductor module that enhances processibility and reduces failure by adjusting a step difference with respect to an arrangement and height of semiconductor devices.

According to a first preferred embodiment of the present invention, there is provided an all-in-one power semiconductor module, including: a plurality of first semiconductor devices formed on a substrate; a housing molded and formed to include bridges formed across upper portions of the plurality of first semiconductor devices; and a plurality of lead members integrally formed with the housing and electrically connecting the plurality of first semiconductor devices and the substrate.

The all-in-one power semiconductor module may further include: a plurality of second semiconductor devices formed on upper portions of the bridges.

The plurality of first semiconductor devices may have different heights, and lengths of the plurality of lead members may be adjusted in such a way that a step difference with respect to the height of each of the plurality of first semiconductor devices is adjusted.

The plurality of lead members may have elasticity.

The number of the plurality of first semiconductor devices may be two, and lead members of a first voltage input terminal and a second voltage input terminal may be connected to the two first semiconductor devices, wherein the lead members of a power input terminal and the first voltage input terminal protrude from one side of the housing, and the lead members of a ground terminal and the second voltage input terminal protrude from the other end of the housing.

The plurality of first semiconductor devices and the plurality of lead frames may be molded by resin.

The housing may include: first and second side wall members vertically disposed; and first and second bridges disposed between the first and second side wall members and extending from the first and second side wall members at a right angle, respectively.

A first housing formed of the first side wall member and the first bridge and a second housing formed of the second side wall member and the second bridge may be diagonal to each other.

The lead member of the power input terminal may protrude from one side of the housing, the lead members of the ground terminal and the second voltage input terminal may protrude from another end of the housing, and the plurality of lead members connected to the plurality of first semiconductor devices may be connected to a second substrate.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
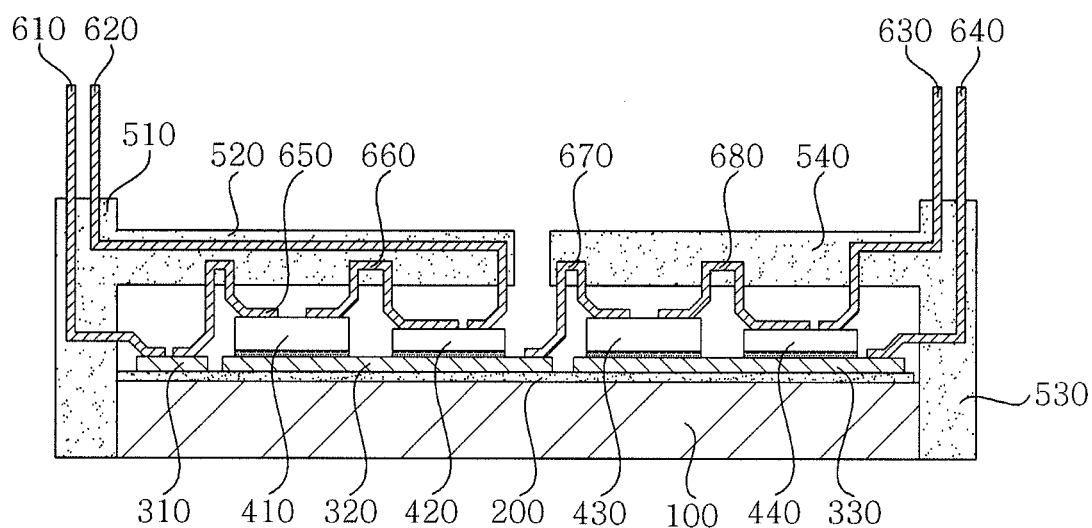
FIG. 1 is a cross-sectional view of an all-in-one power semiconductor module according to a first embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a cross-sectional view of an all-in-one power semiconductor module according to a first embodiment of the present invention.

Referring to FIG. 1, the all-in-one power semiconductor module according to the first embodiment of the present invention may include a base plate 100, an insulation layer 200, a plurality of first substrates 310, 320, and 330, a plurality of first semiconductor devices 410, 420, 430, and 440, a housing, and a plurality of lead members 610, 620, 630, 640, 650, 660, 670, and 680.

The insulation layer 200 is formed on the base plate 100. The plurality of first substrates 310, 320, and 330 are formed on the insulation layer 200.

The plurality of first semiconductor devices 410, 420, 430, and 440 are formed on the plurality of first substrates 310, 320, and 330.

The housing is formed in one end, another end, and an upper portion of the base plate 100.

In this regard, the base plate 100 is formed of metal or ceramic, and the insulation layer 200 is formed of ceramic or resin.

The plurality of first substrates 310, 320, and 330 may be a RF4 printed circuit board (PCB) or a metal core PCB (MCPCB) favorable to heat resistance.

The plurality of lead members 610, 620, 630, 640, 650, 660, 670, and 680 may be lead frames or lead plates.

The plurality of first semiconductor devices 410, 420, 430, and 440 may be insulated gate bipolar mode transistors (IGBT) and diodes, and may be formed on the first substrates 320 and 330.

In this regard, the plurality of first semiconductor devices 410, 420, 430, and 440 may have the same height or different heights.

For example, the plurality of first semiconductor devices 410, 420, 430, and 440 can be two first semiconductor devices or can be three or more first semiconductor devices.

The housing is molded and formed to include first and second bridges 520 and 540 formed across upper portions of the plurality of first semiconductor devices 410, 420, 430, and 440.

The lead members 630 and 640 of a power input terminal and a first voltage input terminal protrude from one side of the housing. The lead members 610 and 620 of a ground terminal and a second voltage input terminal protrude from another end of the housing.

In this regard, the first voltage input terminal and the second voltage input terminal are gates of a first IGBT 420 and a second IGBT 440, respectively, that are the first semiconductor devices, and the ground terminal is an emitter of the IGBT 420.

Also, the housing includes first and second side wall members 510 and 530 and the first and second bridges 520 and 540.

The first and second side wall members 510 and 530 are perpendicularly disposed. The first and second bridges 520 and 540 are disposed between the first and second side wall members 510 and 530 and extend from the first and second side wall members 510 and 530, respectively, at a right angle.

In this regard, a first housing formed of the first side wall 510 and the first bridge 520 and a second housing formed of the second side wall member 530 and the second bridge 540 may be diagonal to each other.

A plurality of circuit patterns or wire patterns (not shown) including a ground pad, an electrode pad, a via hole, etc. used to electrically connect devices used in the all-in-one power semiconductor module according to the present invention or electrically connect devices and substrates may be embedded in the housing (in particular, the first and second bridges 530 and 540), in addition to the plurality of lead members 610, 620, 630, 640, 650, 660, 670, and 680.

The plurality of circuit patterns or wire patterns embedded in the housing may be electrically connected to at least one of the plurality of lead members 610, 620, 630, 640, 650, 660, 670, and 680.

The plurality of lead members 610, 620, 630, 640, 650, 660, 670, and 680 may be integrally formed in the housing, and electrically connect the plurality of first semiconductor devices 410, 420, 430, and 440 and the plurality of first substrates 310, 320, and 330.

Materials of the plurality of lead members 610, 620, 630, 640, 650, 660, 670, and 680 may be nickel, iron alloy, and copper alloy.

In a case where the plurality of first semiconductor devices 410, 420, 430, and 440 have different heights, lengths of the plurality of lead members 610, 620, 630, 640, 650, 660, 670, and 680 are adjusted in such a way that a step difference may be adjusted with respect to a height of each of the plurality of first semiconductor devices 410, 420, 430, and 440.

The plurality of lead members 610, 620, 630, 640, 650, 660, 670, and 680 may be elastic so as to prevent damage and increase a coupling force when connecting devices or substrates.

In a case where the number of the plurality of first semiconductor devices 410, 420, 430, and 440 is 2, each of the two first semiconductor devices 410, 420, 430, and 440 is connected to the lead members 630 and 640 of the first voltage input terminal and the second voltage input terminal.

The plurality of first semiconductor devices 410, 420, 430, and 440 and the plurality of lead members 610, 620, 630, 640, 650, 660, 670, and 680 are molded by resin. In particular, resin may be transparent resin such as epoxy resin and silicon resin.

In connection with an operation of the power semiconductor module, when power is supplied to the power semiconductor module through the power input terminal 640, current sequentially flows through the first IGBT 420, the first diode 410, the second IGBT 440, and the second diode 430 that are the first semiconductor devices and the first substrate 310 through the lead members 650, 660, 670, and 680 according to a voltage input of the first IGBT 420 and the second IGBT 440 through the lead members 630 and 640 of the first voltage input terminal and the second voltage input terminal so that the current flows through the lead member 610 of the ground terminal.

Figure 2:
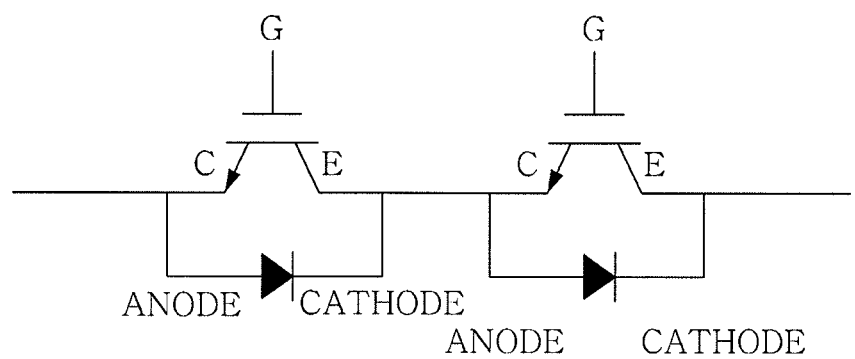
FIG. 2 is a circuit diagram of a semiconductor device used in the all-in-one power semiconductor module of FIG. 1.

FIG. 2 is a circuit diagram of a semiconductor device used in the all-in-one power semiconductor module of FIG. 1.

Referring to FIG. 2, two IGBTs and two diodes may be electrically connected to each other through the plurality of lead members 610, 620, 630, 640, 650, 660, 670, and 680 integrally formed with the housing, and two IGBTs may be electrically connected to each other in the same way.

Each IGBT includes an emitter E, a gate G, and a collector C. Each diode includes anode and cathode.

The cathode of the diode is connected to the emitter E of the IGBT. The anode of the diode is connected to the collector C of the IGBT. The emitter E and the collector C are connected to two IGBTs.

Figure 3:
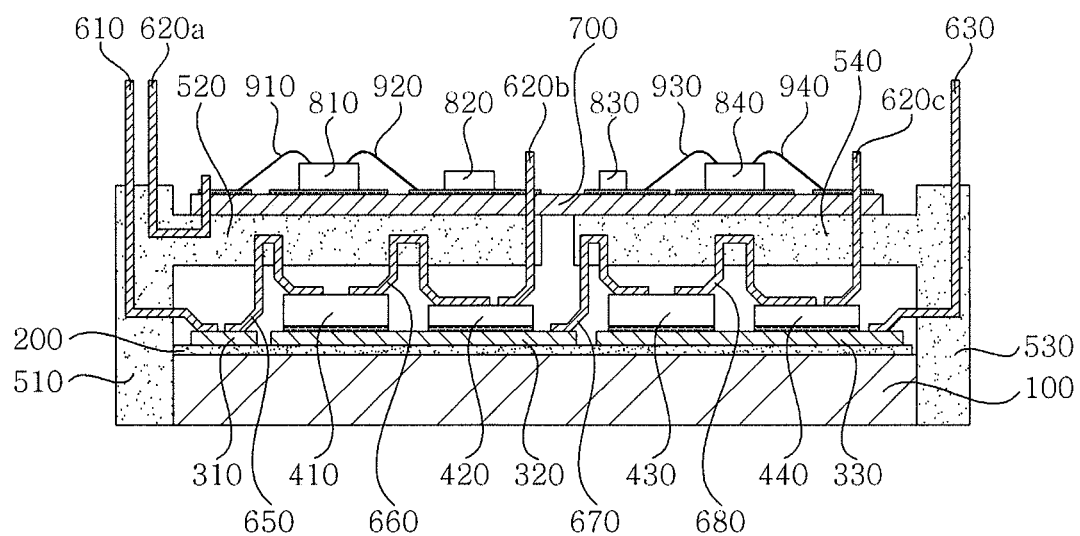
FIG. 3 is a cross-sectional view of an all-in-one power semiconductor module according to a second embodiment of the present invention.

FIG. 3 is a cross-sectional view of an all-in-one power semiconductor module according to a second embodiment of the present invention.

Referring to FIG. 3, the all-in-one power semiconductor module according to the second embodiment of the present invention commonly includes the base plate 100, the insulation layer 200, the plurality of first substrates 310, 320, and 330, the plurality of first semiconductor devices 410, 420, 430, and 440, and a housing, compared to the all-in-one power semiconductor module according to the first embodiment of the present invention. The differences between the first and second embodiments will now be described below. The same description is replaced with the description provided above.

A lead member of a power input terminal 630 protrudes from one side of the housing, and lead members 610 and 620a of a ground terminal and a voltage input terminal protrude from the other side of the housing, respectively.

In this regard, the voltage input terminal is a voltage input terminal of the first and second IGBTs 420 and 440 that are the first semiconductor devices.

Lead members 620b and 620c connected to the first and second IGBTs 420 and 440 are connected to a second substrate 700. The second substrate 700 is formed of the same material as those of the plurality of first substrates 310, 320, and 330. A plurality of second semiconductor devices 810, 820, 830, and 840 are disposed as control devices 810 and 840 such as an IC and passive devices 820 and 830 such as a resistor, an inductor, and a capacitor.

A plurality of second semiconductor devices 810, 820, 830, and 840 are formed on upper portions of bridges 520 and 540.

That is, the second substrate 700 is disposed on the bridges 520 and 540, and the plurality of second semiconductor devices 810, 820, 830, and 840 are formed on the second substrate 700.

The plurality of second semiconductor devices 820 and 840 are connected to the second substrate 700 through wires 910, 920, 930, and 940.

In connection with an operation of the power semiconductor module, current flows to the second substrate 700 through the lead member 620a of the voltage input terminal when power is supplied to the power semiconductor module through the power input terminal 630. The current sequentially flows through the first IGBT 420, the first diode 410, the second IGBT 440, and the second diode 430 that are the first semiconductor devices through the lead members 650, 660, 670, and 680 according to a voltage input of the first IGBT 420 and the second IGBT 440 through the lead members 620b and 620c so that the current flows through the lead member 610 of the ground terminal.

In connection with the all-in-one power semiconductor module according to the embodiments of the present invention, substrate and semiconductor devices are conventionally connected to each other by using wire bonding, which involves a reliability problem.

However, according to the embodiments of the present invention, lead members are used to bond substrates and semiconductor devices without using wire bonding that causes the reliability problem, which increases bonding areas and bonding strength of semiconductor devices, thereby improving the reliability problem.

Further, a housing and lead members are integrally formed, which can enhance processibility and reduce failure by adjusting a step difference with respect to an arrangement and height of semiconductor devices as well as can reduce processing time resulting from an omission of a wire bonding process.

According to the present invention, reliability can be improved by increasing bonding areas and bonding strength of semiconductor devices as well as processibilty can be enhanced and failure can be reduced by adjusting a step difference with respect to an arrangement and height of the semiconductor devices.

Further, a lead frame integrally formed with a housing can be used to electrically connect the semiconductor devices and a substrate or between the semiconductor devices, thereby reducing a processing time resulting from an omission of a wire bonding process.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An all-in-one power semiconductor module, comprising:
a plurality of first semiconductor devices formed on a substrate;
a housing molded and formed to include bridges formed across upper portions of the plurality of first semiconductor devices; and
a plurality of lead members having a portion embedded in the bridges, directly bonded with the plurality of first semiconductor devices, and electrically connecting the plurality of first semiconductor devices and the substrate, wherein at least one of the plurality of lead members is directly connected to at least one of the plurality of first semiconductor devices.

2. The all-in-one power semiconductor module as set forth in claim 1, further comprising:
a plurality of second semiconductor devices formed on upper portions of the bridges.

3. The all-in-one power semiconductor module as set forth in claim 1, wherein the plurality of first semiconductor devices have different heights, and lengths of the plurality of lead members are adjusted in such a way that a step difference with respect to the height of each of the plurality of first semiconductor devices is adjusted.

4. The all-in-one power semiconductor module as set forth in claim 1, wherein the plurality of lead members have elasticity.

5. The all-in-one power semiconductor module as set forth in claim 1, wherein the number of the plurality of first semiconductor devices is two, and lead members of a first voltage input terminal and a second voltage input terminal are connected to the two first semiconductor devices,
wherein the lead members of a power input terminal and the first voltage input terminal protrude from one side of the housing, and the lead members of a ground terminal and the second voltage input terminal protrude from another side of the housing.

6. The all-in-one power semiconductor module as set forth in claim 1, wherein the plurality of first semiconductor devices and the plurality of lead frames are molded by resin.

7. The all-in-one power semiconductor module as set forth in claim 1, wherein the housing includes:
first and second side wall members vertically disposed; and
first and second bridges disposed between the first and second side wall members and extending from the first and second side wall members at a right angle, respectively.

8. The all-in-one power semiconductor module as set forth in claim 7, wherein a first housing formed of the first side wall member and the first bridge and a second housing formed of the second side wall member and the second bridge are diagonal to each other.

9. The all-in-one power semiconductor module as set forth in claim 4, wherein the lead member of the power input terminal protrudes from one side of the housing, the lead members of the ground terminal and the second voltage input terminal protrude from another side of the housing, and the plurality of lead members connected to the plurality of first semiconductor devices are connected to a second substrate.

* * * * *